(12) United States Patent
Eberlein et al.

(10) Patent No.: US 9,176,209 B2
(45) Date of Patent: Nov. 3, 2015

(54) CONTROLLING GRADIENT COILS TAKING THE INDUCTIVE COUPLING INTO ACCOUNT

(75) Inventors: Eva Eberlein, Baiersdorf (DE); Ralph Kimmlingen, Zirndorf (DE); Helmut Lenz, Oberasbach (DE); Franz Schmitt, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 601 days.

(21) Appl. No.: 13/552,442

(22) Filed: Jul. 18, 2012

(65) Prior Publication Data

US 2013/0181713 A1    Jul. 18, 2013

(30) Foreign Application Priority Data

Jul. 20, 2011    (DE) .......................... 10 2011 079 490

(51) Int. Cl.
*G01R 33/54* (2006.01)
*G01R 33/385* (2006.01)

(52) U.S. Cl.
CPC ............ *G01R 33/543* (2013.01); *G01R 33/385* (2013.01); *G01R 33/3852* (2013.01)

(58) Field of Classification Search
CPC . G01R 33/385; G01R 33/543; G01R 33/3852
See application file for complete search history.

(56) References Cited

U.S. PATENT DOCUMENTS

| 5,237,277 | A | 8/1993 | Lenz |
| 5,304,932 | A | 4/1994 | Carlson |
| 5,530,356 | A | 6/1996 | Yokoi |
| 6,400,158 | B1 | 6/2002 | Van Groningen et al. |
| 6,448,775 | B1 * | 9/2002 | Lenz .............................. 324/322 |
| 6,501,977 | B1 | 12/2002 | Kimmlingen |
| 8,502,539 | B2 * | 8/2013 | Lai et al. ........................ 324/318 |
| 2003/0042905 | A1 | 3/2003 | Miyazaki et al. |

FOREIGN PATENT DOCUMENTS

| CN | 100453039 C | 1/2009 |
| DE | 40 20 213 A1 | 1/1992 |

(Continued)

OTHER PUBLICATIONS

German Office Action dated Apr. 19, 2012 for corresponding German Patent Application No. DE 10 2011 079 490.5 with English translation.

(Continued)

*Primary Examiner* — Dixomara Vargas
(74) *Attorney, Agent, or Firm* — Lempia Summerfield Katz LLC (57) ABSTRACT

A gradient pulse generator generates reference current signals for a plurality of gradient coils of a gradient coil system of a magnetic resonance system and supplies each of the reference current signals to a controller assigned to one of the gradient coils. Also supplied to the respective controller is an actual current signal that is characteristic of the current flowing in the respective gradient coil. Each of the controllers generates a control signal and accordingly drives a gradient power amplifier assigned to the respective gradient coil. The gradient power amplifiers apply a current to the gradient coils assigned to the gradient power amplifiers in accordance with the generated control signals. Each of the controllers is also supplied with the reference current signal or the actual current signal of at least one other gradient coil or the time derivative of the reference current signal or the actual current signal.

20 Claims, 4 Drawing Sheets

(56) References Cited

FOREIGN PATENT DOCUMENTS

| | | |
|---|---|---|
| DE | 198 56 800 C1 | 6/2000 |
| DE | 199 55 117 A1 | 5/2001 |
| EP | 2261685 A1 | 12/2010 |
| JP | 2003514643 A | 4/2003 |
| WO | WO0138893 A2 | 5/2001 |

OTHER PUBLICATIONS

Chinese Office action for related Chinese Application No. 2012102537178, dated Jul. 21, 2015, with English Translation.

* cited by examiner

CONTROLLING GRADIENT COILS TAKING THE INDUCTIVE COUPLING INTO ACCOUNT

This application claims the benefit of DE 10 2011 079 490.5, filed on Jul. 20, 2011.

BACKGROUND

The present embodiments relate to a control method for driving a plurality of gradient coils of a gradient coil system of a magnetic resonance system.

The gradient coils of a gradient coil system of a magnetic resonance system may be inductively coupled to one another. This applies in the case where the gradient coil system has a plurality of gradient coils for three orthogonal axes of a Cartesian coordinate system. On account of the inductive coupling, a dependence in relation to a specific gradient coil of the voltage required for generating a specific current on the activation state of the other gradient coils results.

Controllers may be tuned to the state, in which the same current is applied to all coils of a specific gradient axis. Methods for identifying and setting good controller parameters for a mode of operation of the type are well known.

The prior art approach delivers good results only when the currents of the gradient coils, insofar as gradient coils generate a gradient of the magnetic field in the same direction, are the same in relation to one another. If the currents are different from one another, the regulating function operates only at a suboptimal level. This may lead to artifacts during the image reconstruction. The problem arises when the current conditions are time-variable.

SUMMARY AND DESCRIPTION

The present embodiments may obviate one or more of the drawbacks or limitations in the related art. For example, currents applied to gradient coils of a gradient coil system may be optimally controlled even when the currents and/or the conditions of the currents in relation to one another are time-variable.

In one embodiment of a control method, controllers are each supplied with a reference or actual current signal of at least one other gradient coil or a time derivative of the reference or actual current signal. The controllers generate the respective control signal on the basis of the respective reference current signal, the respective actual current signal, and the time derivative of the reference or actual current signals of the other gradient coils supplied to controllers or the time derivatives of the reference or actual current signals of the other gradient coils supplied to controllers. The time derivatives of the reference or actual current signals of the other gradient coils supplied to the controllers are included in the generation of the respective control signal in accordance with the inductive coupling of the gradient coil assigned to the respective controller to the respective other gradient coil.

The gradient coil system may include a plurality of gradient coils for three orthogonal axes of a Cartesian coordinate system. The controllers may be supplied at least with the reference or actual current signals or the time derivatives of the reference or actual current signals of the gradient coils that are assigned to the same axis as the respective gradient coil.

In one embodiment, the controllers are supplied exclusively with the current signals or the time derivatives of the current signals. In other words, each of the controllers is not supplied with the reference or actual current signals or the time derivatives of the reference of actual current signals of the gradient coils that are assigned to a different axis than the respective gradient coil. Alternatively, each of the controllers may also be supplied with the reference or actual current signals or the time derivatives of the reference or actual current signals of the gradient coils that are assigned to a different axis than the respective gradient coil.

On account of the inductive coupling, a current change in one of the gradient coils induces a voltage in the other gradient coils. The controllers may generate a respective correction signal on the basis of a sum of the time derivatives, weighted with the corresponding inductive couplings, of the reference or actual current signals of the other gradient coils supplied to the controllers or the time derivatives of the reference or actual current signals of the other gradient coils supplied to controllers. In the case of a single time derivative, the sum is reduced to the individual time derivative.

The controllers determine the control signal on the basis of the respective reference current signal, the respective actual current signal, and the respective correction signal. Two approaches may be used. In one embodiment, the controllers may generate a respective controller output signal on the basis of the respective reference current signal and the respective actual current signal. The control signal of the respective controller may correspond to the sum of the respective controller output signal and respective correction signal. Alternatively, the controllers may determine a respective controller input signal on the basis of the respective correction signal, the respective reference current signal, and the respective actual current signal. The controllers may generate the respective control signal on the basis of the respective controller input signal.

Depending on the circumstances of the individual case, the impact of a current change in one of the gradient coils may have an immediate or time-delayed effect on another of the gradient coils. In the case of a delayed effect, the controllers may delay the time derivatives of the reference or actual current signals of the other gradient coils supplied to the controllers by a respective delay.

In one embodiment of a gradient coil system, each of the controllers is supplied with the reference or actual current signal of at least one other gradient coil or the time derivative of the reference or actual current signal. The controllers generate the respective control signal on the basis of the respective reference current signal, the respective actual current signal, and the time derivatives of the reference or actual current signals of the other gradient coils supplied to controllers or the time derivatives of the reference or actual current signals of the other gradient coils supplied to the controllers. The time derivatives of the reference or actual current signals of the other gradient coils supplied to the controllers are included in the generation of the respective control signal in accordance with the inductive coupling of the gradient coil assigned to the respective controller to the respective other gradient coil.

The embodiments of the gradient coil system substantially correspond to the advantageous embodiments of the control method.

In another embodiment, a magnetic resonance system includes the gradient coil system embodied as explained hereinabove.

DETAILED DESCRIPTION OF THE DRAWINGS

Figure 1:
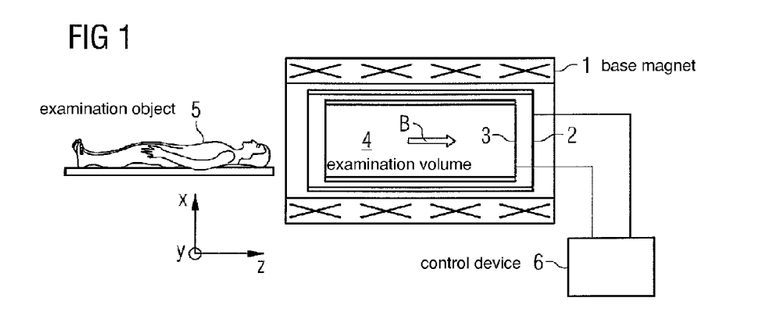
FIG. 1 shows one embodiment of a magnetic resonance system.

Referring to FIG. 1, a magnetic resonance system includes a base magnet 1, a gradient coil system 2 and at least one radio-frequency system 3. A temporally static, locally substantially homogeneous magnetic field B of, for example, 1.5 tesla or 3 tesla is generated by the base magnet 1 in an examination volume 4 of the magnetic resonance system. The magnetic field B is varied slightly by the gradient coil system 2, and in such a way that, at least in a first approximation, although a direction of the magnetic field B as such remains unchanged, the magnitude of the magnetic field B varies linearly with the location. The corresponding embodiment and functionality of the gradient coil system 2 may be known. The radio-frequency system 3 enables an examination object 5 (e.g., a human patient) introduced into the examination volume 4 to be stimulated into emitting magnetic resonance signals. Thus, excited magnetic resonance signals may be received by the radio-frequency system 3 (or in another radio-frequency system not shown in the figures). The embodiment and functionality of the radio-frequency system 3 may also be known.

Figure 2:
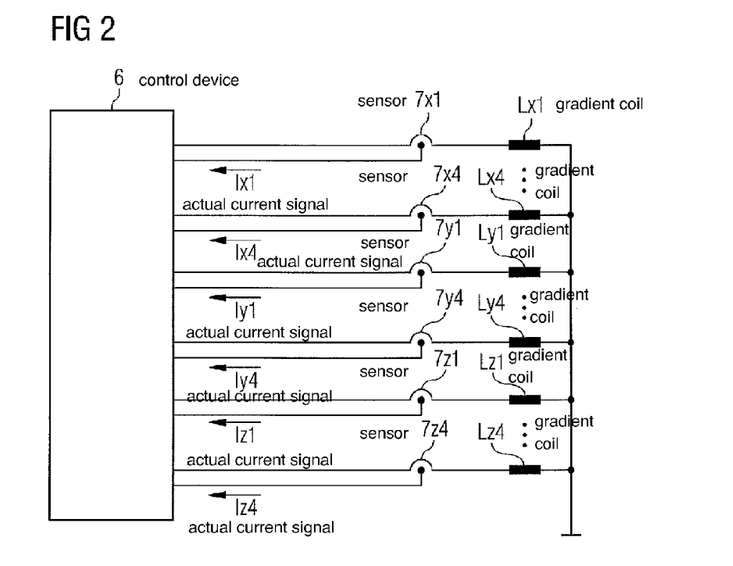
FIG. 2 shows one embodiment of a gradient coil system of the magnetic resonance system from FIG. 1.

Referring to FIG. 2, the gradient coil system 2 includes a plurality of gradient coils Lij (i=x, y, z; j=1, 2, 3 ... N). In one embodiment, three gradient coils Lij are present (e.g., one gradient coil Lij (N=1) per axis x, y, z of a right-angled Cartesian coordinate system). According to FIG. 2, a plurality of gradient coils Lij are present for each axis x, y, z. However, the depicted number of four gradient coils Lij (N=4) per coordinate axis x, y, z is purely exemplary. Two, three, five, or six gradient coils Lij per axis x, y, z, for example, may also be used.

Referring to FIG. 2, a respective current is applied to the gradient coils Lij by a control device 6 of the magnetic resonance system. The currents are measured by corresponding sensors $7ij$. Corresponding actual current signals Iij that are characteristic of the respective current are supplied to the control device 6.

The manner in which the currents are generated is the same in principle for all the gradient coils Lij. The manner in which the currents are generated is therefore shown in FIG. 3 for a single gradient coil Lij only (e.g., for a single channel of the gradient coil system 2). The channel for the gradient coil Lx1 is singled out purely by way of example in this connection. However, the conditions explained below in conjunction with FIG. 3 and the other figures are equally valid for all the gradient coils Lij.

Figure 3:
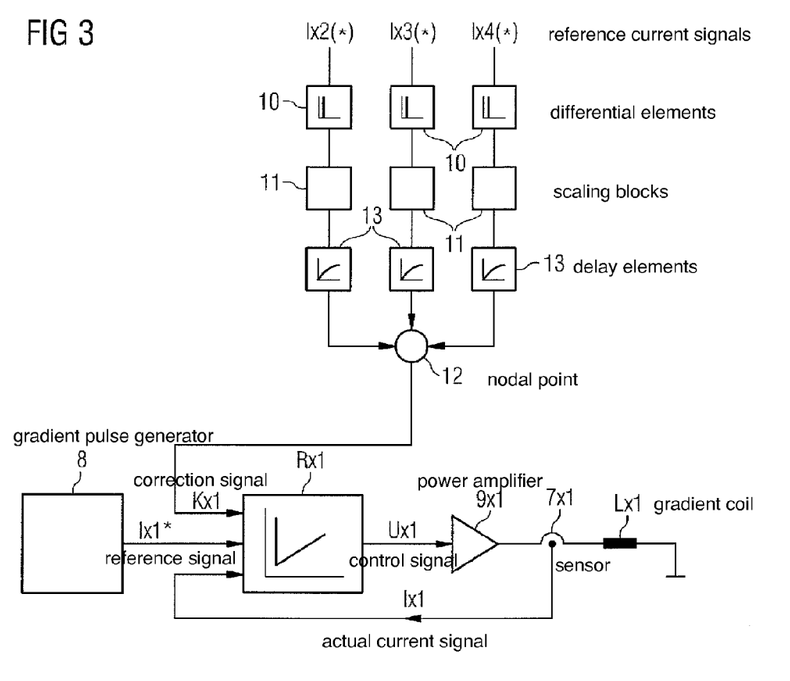
FIGS. 3 and 4 each show an exemplary individual channel of the gradient coil system from FIG. 2.

Referring to FIG. 3, the gradient coil system 2 has a gradient pulse generator 8. The gradient pulse generator 8 may be part of the control device 6. The gradient pulse generator 8 may be implemented using software. The gradient pulse generator 8 may be present as standard for all the gradient coils Lij. The corresponding reference current signals Iij* are generated for the gradient coils Lij by the gradient pulse generator 8.

A controller Rij is assigned to each gradient coil Lij. The controller Rij may be realized in software. Alternatively the controller Rij may be implemented as a real hardware controller. The controller Rij is supplied with the corresponding reference current signal Iij* and the corresponding actual current signal Iij. The controllers Rij generate a respective control signal Uij that the controllers Rij supply to a respective gradient power amplifier $9ij$ assigned to the corresponding gradient coil Lij. The controllers Rij thereby drive the corresponding gradient power amplifier $9ij$ accordingly. Because the gradient power amplifiers $9ij$ are power elements, the gradient power amplifiers $9ij$ are implemented in hardware. The gradient power amplifiers $9ij$ apply the corresponding current to the respective gradient coil Lij assigned to the gradient power amplifiers $9ij$ in accordance with the generated control signal Uij.

The controllers Rij generate the respective control signal Uij on the basis of the respective reference current signal Iij*, the respective actual current signal Iij, and a respective correction signal Kij.

For the purpose of determining the corresponding correction signal Kij, the corresponding controller Rij may be supplied with the reference current signal Imn* (e.g., mn≠ij) of at least one other gradient coil Lmn or the corresponding actual current signal Imn. Referring to FIG. 3, the controller Rx1 for the gradient coil Lx1, for example, is supplied at least with the reference current signals Ix2*, Ix3*, Ix4* or the corresponding actual current signals Ix2, Ix3, Ix4 of all the gradient coils Lx2, Lx3, Lx4 that are assigned to the same axis x as the gradient coil Lx1 under consideration.

Since the time derivatives Ix2*', Ix3*', Ix4*', Ix2', Ix3', Ix4' of the corresponding current signals Ix2*, Ix3*, Ix4*, Ix2, Ix3, Ix4 are also of significance within the scope of the present embodiments, the time derivatives Ix2*', Ix3*', Ix4*', Ix2', Ix3', Ix4' are formed in corresponding differentiating elements 10. The differentiating elements 10 may be part of the corresponding controller Rij. The controllers Rij may, as explained hereintofore, be supplied directly with the corresponding current signals Imn* or Imn. Alternatively the time derivatives Imn*', Imn' may be determined in advance (e.g., outside of the corresponding controller Rij). The differentiating elements 10 are disposed outside of the corresponding controller Rij, and the time derivatives Imn*', Imn' of the corresponding current signals Imn*, Imn are supplied to the controller Rij. For example, the time derivatives Imn*', Imn' may be determined centrally by the control device 6 and made available to the controllers Rij.

The time derivatives Imn*', Imn' of the corresponding current signals Imn*, Imn are weighted in scaling blocks 11 in accordance with the respective inductive coupling of the respective other gradient coil Lmn to the gradient coil Lij under consideration and summed in a nodal point 12. The relevant correction signal Kij accordingly corresponds to the weighted sum of the time derivatives Imn*', Imn' of the reference current signals or the actual current signals Imn*, Imn that are supplied to the respective controller Rij in addition to the reference current signal Iij* and the actual current signal Iij of the respective controller Rij. The weighting factors of the scaling blocks 11 correspond to the respective inductive coupling of the gradient coils Lij in relation to one another. The coupling factors between the individual gradient coils Lij, which determine the scaling in the scaling blocks 11, may be determined, for example, using measurement techniques. The determination of the factors using measurement techniques may be accomplished, for example, using experiments conducted by an operator of the magnetic resonance system. Alternatively, the control device 6 may determine the weighting factors independently in an automated test run (e.g., "tune-up").

Figure 4:
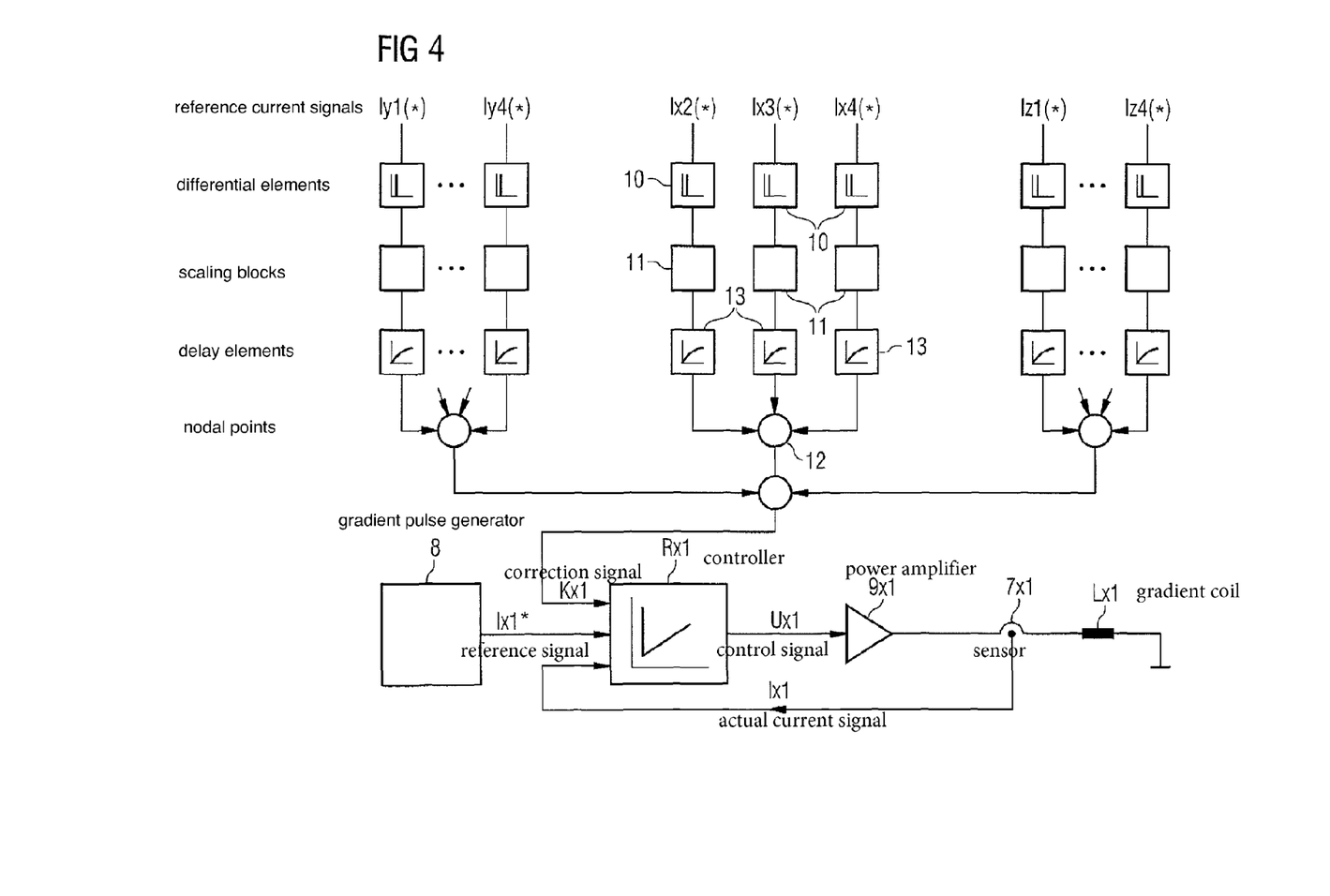

The time derivatives Iin*', Iin' of the current signals Iin*, Iin (n≠j) that act on the gradient coils Lin that are assigned to the same axis i as the gradient coil Lij under consideration may be used. This embodiment is shown in FIG. 3. With the embodiment, the reference or actual current signals Imn*, Imn of the gradient coils Lmn that are assigned to a different axis x, y, z than the considered gradient coil Lij are not supplied to the controller Rij. Thus, m≠i applies to the current signals Imn*, Imn. In this case, an analogous situation applies also to the corresponding time derivatives Imn*', Imn'. Alternatively, the corresponding controller Rij may also be supplied with the current signals Imn*, Imn or the corresponding time derivatives Imn*', Imn'. In this case, the corresponding gradient coils Lmn act on other axes m. This embodiment is shown in FIG. 4.

The correspondingly weighted time derivatives Imn*', Imn' may be used directly and immediately. Alternatively, according to the schematic diagrams shown in FIGS. 3 and 4, the controllers Rij may have delay elements 13. Using the delay elements 13, the time derivatives Imn*', Imn' of the current signals Imn*, Imn of the other gradient coils Lmn are delayed by a corresponding, individually determined delay. The delay times, by which the respective time derivatives Imn*', Imn' are delayed in the delay elements 13, may, for example, be determined analogously to the weighting factors in an automated manner or experimentally.

Figure 5:
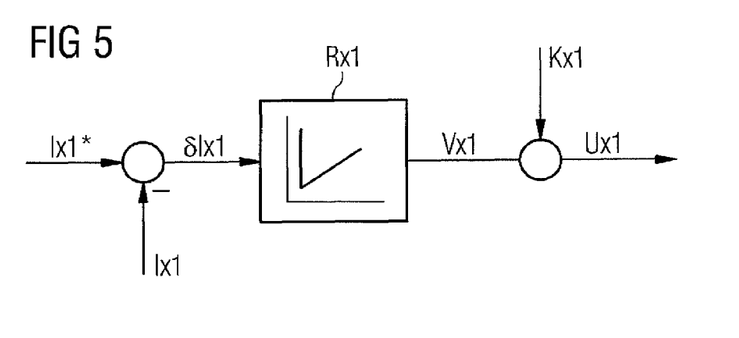
FIGS. 5 to 7 each show one embodiment of a controller.
Figure 6:
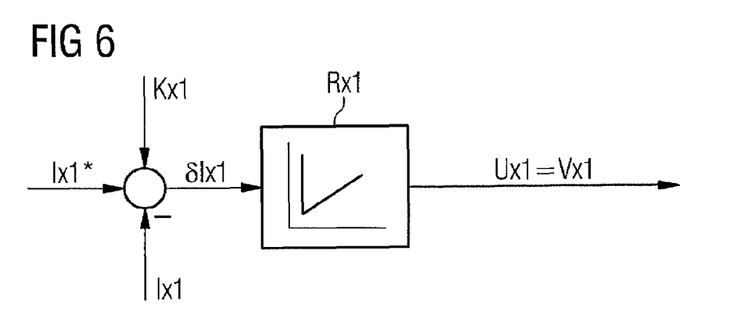

Referring to FIG. 5, in order to take into account the correction signal Kij in the determination of the control signal Uij, the corresponding controller Rij may initially determine a respective controller input signal δIij on the basis of the respective reference current signal Iij* and the corresponding actual current signal Iij and generate a respective controller output signal Vij on the basis of the controller input signal δIij. In this case, the control signal Uij corresponds to the sum of the controller output signal Vij and the correction signal Kij. Alternatively, according to the schematic diagram of FIG. 6, the controllers Rij may initially determine the respective controller input signal δIij on the basis of the respective correction signal Kij, the respective reference current signal Iij* and the respective actual current signal Iij and generate the respective control signal Uij on the basis of the respective controller input signal δIij. In this case, the controller output signal Vij is the same as the control signal Uij.

Figure 7:
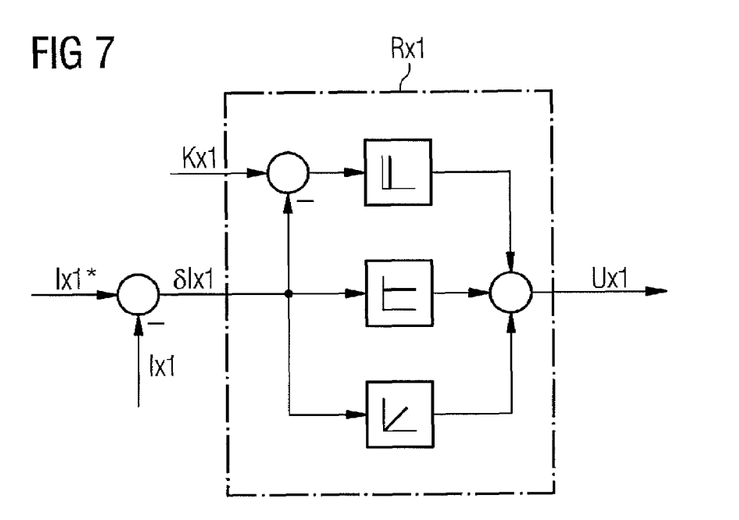

Referring to the schematic diagram of FIG. 7, if the controllers Rij have a differential component (e.g., if the controllers Rij are embodied as PID controllers), with respect to an input signal being taken into account within the scope of the differential branch of the respective controller Rij,), the correction signal Kij may be applied to the control deviation δIij. With respect to the other controller branches (e.g., a proportional and an integral branch) and may only work with the difference between respective reference current signal Iij* and actual current signal Iij.

In one embodiment, a gradient pulse generator 8 generates reference current signals Iij* for a plurality of gradient coils Lij of a gradient coil system 2 of a magnetic resonance system. The gradient pulse generator 8 supplies the reference current signals Iij* in each case to a controller Rij assigned to one of the gradient coils Lij. In addition, the respective controller Rij is supplied in each case with an actual current signal Iij that is characteristic of the current flowing in the respective gradient coil Lij. The controllers Rij in each case generate a control signal Uij and accordingly drive a gradient power amplifier 9ij assigned to the respective gradient coil Lij. The gradient power amplifiers 9ij apply a current to the gradient coils Lij assigned to the gradient power amplifiers 9ij in accordance with the generated control signals Uij. The controllers Rij are additionally supplied in each case with the reference or actual current signal Imn*, Imn of at least one other gradient coil Lmn or the time derivative of the reference or actual current signal Imn*', Imn'. The controllers Rij generate the respective control signal Uij on the basis of the respective reference current signal Iij*, the respective actual current signal Iij and the time derivatives Imn*', Imn' of the reference or actual current signals Imn*, Imn of the other gradient coils Lmn supplied to the controllers Rij or the time derivatives Imn*', Imn' of the reference or actual current signals Imn*, Imn of the other gradient coils Lmn supplied to controllers Rij. The time derivatives Imn*', Imn' of the reference or actual current signals Imn*, Imn of the other gradient coils Lmn are included in the generation of the respective control signal Uij in accordance with the inductive coupling of the respective gradient coil Lij to the respective other gradient coil Lmn.

The present embodiments provide many advantages. For example, an almost fully decoupled operation of the gradient coils Lij of the gradient coil system 2 may be provided. This results in virtually optimal control characteristics with any current shapes.

Although the invention has been illustrated and described in detail with reference to the present exemplary embodiments, the invention is not limited by the disclosed examples, and other variations may be derived herefrom by the person skilled in the art without departing from the protective scope of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A control method for a plurality of gradient coils of a gradient coil system of a magnetic resonance system, the control method comprising:

generating reference current signals for the plurality of gradient coils by a gradient pulse generator;

supplying each of the reference current signals to a controller assigned to each gradient coil of the plurality of gradient coils;

supplying each of the controllers with an actual current signal that is characteristic of the reference current signal flowing in the respective gradient coil;

generating, using the controllers, control signals and driving gradient power amplifiers assigned to the plurality of gradient coils in accordance with the generated control signals; and applying, using the gradient power amplifiers, currents to the plurality of gradient coils assigned to the gradient power amplifiers in accordance with the generated control signals, wherein the controllers are each supplied with the reference current signal or the actual current signal of at least one other gradient coil of the plurality of gradient coils or the time derivative of the reference current signal or the actual current signal of at least one other gradient coil of the plurality of gradient coils, wherein the controllers generate the respective control signal on the basis of the respective reference current signal, the respective actual current signal and the time derivative of the reference current signal or the actual current signal of the at least one other gradient coil supplied to the controllers, or the time derivative of the reference current signal or the actual current signal of the at least one other gradient coil supplied to the controllers, and wherein the time derivative of the reference current signal or the actual current signal of the at least one other gradient coil supplied to the controllers are included in the generation of the respective control signal in accordance with an inductive coupling of the gradient coil assigned to the respective controller to the at least one other gradient coil.

2. The control method as claimed in claim 1, wherein the plurality of gradient coils comprises a first plurality of gradient coils, a second plurality of gradient coils, and a third plurality of gradient coils for three orthogonal axes of a Cartesian coordinate system, respectively, and wherein the controllers are each supplied with the reference current signals or the actual current signals or the time derivative of the reference current signals or the actual current signals of gradient coils of the plurality of gradient coils that are assigned to the same axis as the respective gradient coil.

3. The control method as claimed in claim 2, wherein each of the controllers is not supplied with the reference current signals or the actual current signals of the at least one other gradient coil or the time derivative of the reference current signals or the actual current signals that are assigned to a different axis than the respective gradient coil.

4. The control method as claimed in claim 2, wherein each of the controllers is also supplied with the reference current signals or the actual current signals of the at least one other gradient coil or the time derivative of the reference current signals or the actual current signals that are assigned to a different axis than the respective gradient coil.

5. The control method as claimed in claim 1, further comprising:

generating, using each of the controllers, a respective correction signal on the basis of a sum of the time derivatives, weighted with the corresponding inductive couplings of the reference current signals or the actual current signals of the other gradient coils supplied to the controllers or the time derivatives of the reference current signals or the actual current signals of the other gradient coils supplied to the controller; and generating, using each of the controllers, a respective controller output signal on the basis of the respective reference current signal and the respective actual current signal, wherein the control signal of the respective controller corresponds to the sum of the respective controller output signal and respective correction signal.

6. The control method as claimed in claim 1, further comprising:

generating, using each of the controllers, a respective correction signal on the basis of a sum of the time derivatives, weighted with the corresponding inductive couplings, of the reference current signals or the actual current signals of the other gradient coils supplied to the controllers or the time derivatives of the reference current signals or the actual current signals of the other gradient coils supplied to the controllers;

determining, using each of the controllers, a respective controller input signal on the basis of the respective correction signal, the respective reference current signal and the respective actual current signal; and generating the respective control signal on the basis of the respective controller input signal.

7. The control method as claimed in claim 1, wherein the time derivatives of the reference current signals or the actual current signals of the other gradient coils supplied to the controllers are delayed by a respective delay.

8. A gradient coil system of a magnetic resonance system, the gradient coil system comprising:

a plurality of gradient coils;

a gradient pulse generator operable to generate reference current signals for the plurality of gradient coils;

controllers that are assigned to the plurality of gradient coils, the controllers being supplied with the respective reference current signal, wherein each of the controllers is supplied with an actual current signal that is characteristic of a current flowing in the respective gradient coil of the plurality of gradient coils, and wherein each of the controllers is operable to generate a control signal; and gradient power amplifiers that are assigned to the plurality of gradient coils, the controllers operable to drive the gradient power amplifiers in accordance with the control signals, wherein each of the gradient power amplifiers is operable to apply a current to the gradient coil assigned to the gradient power amplifier in accordance with the generated control signal, wherein each of the controllers is supplied with the reference current signal or the actual current signal of at least one other gradient coil of the plurality of gradient coils or the time derivative of the reference current signal or the actual current signal of at least one other gradient coil of the plurality of gradient coils, wherein each of the controllers is operable to generate the respective control signal on the basis of the respective reference current signal, the respective actual current signal and the time derivatives of the reference current signals or the actual current signals of the other gradient coils supplied to the controllers, and wherein the time derivatives of the reference current signals or the actual current signals of the other gradient coils supplied to the controllers are included in the generation of the respective control signal in accordance with the inductive coupling of the gradient coil assigned to the respective controller to the at least one respective other gradient coil.

9. The gradient coil system as claimed in claim 8, wherein the plurality of gradient coils comprises a first plurality of gradient coils, a second plurality of gradient coils, and a third plurality of gradient coils for three orthogonal axes of a Cartesian coordinate system, respectively, and wherein each of the controllers is supplied with the reference current signals or the actual current signals of the gradient coils or the time derivatives of the reference current signals or the actual current signals that are assigned to the same axis as the respective gradient coil.

10. The gradient coil system as claimed in claim 9, wherein each of the controllers is not supplied with the reference current signals or the actual current signals of the other gradient coils or the time derivatives of the reference current signals or the actual current signals that are assigned to a different axis than the respective gradient coil.

11. The gradient coil system as claimed in claim 9, wherein each of the controllers is also supplied with the reference current signals or the actual current signals of the other gradient coils or the time derivatives of the reference current signals or the actual current signals that are assigned to a different axis than the respective gradient coil.

12. The gradient coil system as claimed in claim 8, wherein each of the controllers is operable to generate a respective correction signal on the basis of a sum of the time derivatives, weighted with the corresponding inductive couplings, of the reference current signals or the actual current signals of the other gradient coils supplied to controllers or the time derivatives of the reference current signals or the actual current signals of the other gradient coils supplied to the controllers,
wherein each of the controllers is operable to generate a respective controller output signal on the basis of the respective reference current signal and the respective actual current signal, and
wherein the control signal of the respective controller corresponds to the sum of the respective controller output signal and the respective correction signal.

13. The gradient coil system as claimed in claim 8, wherein each of the controllers is operable to generate a respective correction signal on the basis of a sum of the time derivatives, weighted with the corresponding inductive couplings, of the reference current signals or the actual current signals of the other gradient coils supplied to controllers or the time derivatives of the reference current signals or the actual current signals of the other gradient coils supplied to controllers, and
wherein each of the controllers is operable to determine a respective controller input signal on the basis of the respective correction signal, the respective reference current signal and the respective actual current signal and is operable to generate the respective control signal on the basis of the respective controller input signal.

14. The gradient coil system as claimed in claim 8, further comprising delay elements operable to delay the time derivatives of the reference current signals or the actual current signals of the other gradient coils supplied to the controllers.

15. A magnetic resonance system comprising:
a base magnet;
a gradient coil system; and
at least one radio-frequency system,
wherein the gradient coil system comprises:
a plurality of gradient coils;
a gradient pulse generator operable to generate reference current signals for the plurality of gradient coils;
controllers that are assigned to the plurality of gradient coils, the controllers being supplied with the respective reference current signal, wherein each of the controllers is supplied with an actual current signal that is characteristic of a current flowing in the respective gradient coil of the plurality of gradient coils, and wherein each of the controllers is operable to generate a control signal; and
gradient power amplifiers that are assigned to the plurality of gradient coils, the controllers operable to drive the gradient power amplifiers in accordance with the control signals, wherein each of the gradient power amplifiers is operable to apply a current to the gradient coil assigned to the gradient power amplifier in accordance with the generated control signal,
wherein each of the controllers is supplied with the reference current signal or the actual current signal of at least one other gradient coil of the plurality of gradient coils or the time derivative of the reference current signal or the actual current signal of at least one other gradient coil of the plurality of gradient coils,
wherein each of the controllers is operable to generate the respective control signal on the basis of the respective reference current signal, the respective actual current signal and the time derivatives of the reference current signals or the actual current signals of the other gradient coils supplied to the controllers, and
wherein the time derivatives of the reference current signals or the actual current signals of the other gradient coils supplied to the controllers are included in the generation of the respective control signal in accordance with the inductive coupling of the gradient coil assigned to the respective controller to the at least one respective other gradient coil.

16. The magnetic resonance system as claimed in claim 15, wherein the plurality of gradient coils comprises a first plurality of gradient coils, a second plurality of gradient coils, and a third plurality of gradient coils for three orthogonal axes of a Cartesian coordinate system, respectively, and
wherein each of the controllers is supplied with the reference current signals or the actual current signals of the gradient coils or the time derivatives of the reference current signals or the actual current signals that are assigned to the same axis as the respective gradient coil.

17. The magnetic resonance system as claimed in claim 16, wherein each of the controllers is not supplied with the reference current signals or the actual current signals of the other gradient coils or the time derivatives of the reference current signals or the actual current signals that are assigned to a different axis than the respective gradient coil.

18. The magnetic resonance system as claimed in claim 16, wherein each of the controllers is also supplied with the reference current signals or the actual current signals of the other gradient coils or the time derivatives of the reference current signals or the actual current signals that are assigned to a different axis than the respective gradient coil.

19. The gradient coil system as claimed in claim 15, wherein each of the controllers is operable to generate a respective correction signal on the basis of a sum of the time derivatives, weighted with the corresponding inductive couplings, of the reference current signals or the actual current signals of the other gradient coils supplied to controllers or the time derivatives of the reference current signals or the actual current signals of the other gradient coils supplied to the controllers,
wherein each of the controllers is operable to generate a respective controller output signal on the basis of the respective reference current signal and the respective actual current signal, and
wherein the control signal of the respective controller corresponds to the sum of the respective controller output signal and the respective correction signal.

20. The gradient coil system as claimed in claim 15, wherein each of the controllers is operable to generate a respective correction signal on the basis of a sum of the time derivatives, weighted with the corresponding inductive couplings, of the reference current signals or the actual current signals of the other gradient coils supplied to controllers or the time derivatives of the reference current signals or the actual current signals of the other gradient coils supplied to controllers, and
wherein each of the controllers is operable to determine a respective controller input signal on the basis of the respective correction signal, the respective reference current signal and the respective actual current signal and is operable to generate the respective control signal on the basis of the respective controller input signal.

* * * * *